United States Patent [19]

Wegmann et al.

[11] Patent Number: 5,041,712
[45] Date of Patent: Aug. 20, 1991

[54] METHOD FOR THE CONTROL OF AN EVAPORATION PROCESS

[75] Inventors: Urs Wegmann, Oberschan; Albert Koller, Trübbach, both of Switzerland

[73] Assignee: Balzers Aktiengesellschaft, Balzers, Liechtenstein

[21] Appl. No.: 543,694

[22] Filed: Jun. 26, 1990

[30] Foreign Application Priority Data

Jun. 27, 1989 [DE] Fed. Rep. of Germany ....... 3921040

[51] Int. Cl.⁵ .............................................. B23K 15/00
[52] U.S. Cl. .......................... 219/121.15; 219/121.12; 219/121.35; 250/397; 250/399
[58] Field of Search ...................... 219/121.15, 121.12, 219/121.35; 373/12, 13, 14; 250/399, 397, 398, 492.3

[56] References Cited

U.S. PATENT DOCUMENTS

| | | | |
|---|---|---|---|
| 3,420,977 | 1/1969 | Hanks et al. | 219/121.15 X |
| 4,064,352 | 12/1977 | Mann | 373/13 |
| 4,264,822 | 4/1981 | Ueno et al. | 250/399 |
| 4,988,872 | 1/1991 | Nagatsuka et al. | 250/397 X |
| 5,001,344 | 3/1991 | Kato et al. | 250/357 X |
| 5,008,537 | 4/1991 | Toita et al. | 250/397 X |

Primary Examiner—C. L. Albritton
Attorney, Agent, or Firm—Notaro & Michalos

[57] ABSTRACT

A method and apparatus for controlling, regulating and measuirng the particle mass which is evaporated per unit time from a target by a charged particle beam, in particular an electron beam, comprises the varying of an impingement area of the beam on the target in a manner which is decoupled from control of the position of the impingement area and control of the mass current of the beam. The impingment area may be modulated for varying the particle mass and the particle mass can be measured by also using a modulation step in conjunction with a particle detector and a beam modulation step.

47 Claims, 7 Drawing Sheets 5,041,712

METHOD FOR THE CONTROL OF AN EVAPORATION PROCESS

FIELD AND BACKGROUND OF THE INVENTION

The present invention relates to a method for the control of a particle mass which is evaporated per unit time by a particle beam striking a target. The particle beam is specifically a beam of charged particles, and in particular an electron beam in which the size of the impingement area of the beam on the target material is varied.

In the evaporation of targets by means of electron beams during vacuum coating processes, it is important to be able to influence the particle mass per unit time which is evaporated from the target material.

It is known in this connection, from IEEE Transactions on Magnetics, Vol. MAG-11, No. 2, March 1975 "Electron Beam Evaporation Synthesis of A15 Superconducting Compounds: Accomplishments and Prospects" by R. H. Hammond, to drive the mass current of the generated electron beam by changing the heating current of an emission electrode in the beam generator. With changing mass current of the electron beam, corresponding changes in the masses of particles evaporate from the target area on which the electron beam impinges, also take place.

This approach is disadvantageous since there is a long reaction time between application of a changed heating current and the effect with respect to mass current of the electron beam. Changing heating current as a final control element thus behaves like a lowpass element with high time constant. It is known that such elements, in particular when used on control circuits, are extremely disadvantageous, because fast guidance signal changes cannot take place rapidly nor are disturbances of higher frequency controlled unless expensive compensation measures are taken. Control circuits with such final control elements consequently have extremely high inertia. In the above cited article limit frequencies of up to 1 Hz are given.

In order to eliminate this disadvantage, the above cited article further suggests controlling the dwelling time of the electron beam at a site on the target material. In this way, the degree of heating is controlled locally at the target. To this end, a relatively complex system is required to shift the electron beam back and forth with precise control at the target. Moreover, the evaporated particle mass depends not only on the dwelling time of the electron beam at one place on the target, but also on the prior thermal history which this place or its environment have experienced. Through such dwelling time control, an unsteady evaporation is obtained, since the vaporization point is moved back and forth. It is, however, a goal of an effective rate control scheme to carry out evaporation as steadily as possible.

The dependency between dwelling time and evaporated particle mass is consequently relatively complex.

With this approach used as the regulating method in a control circuit according to the above cited article, limit frequencies of up to 10 Hz can be achieved.

Furthermore it is known from Proceedings of the Eighth International Vacuum Congress, Sept. 22-26, 1980, Cannes, France, Volume II "Vacuum Technology and Vacuum Metallurgy", pp. 542, "Closed loop multi source evaporation rate control with a quadruple mass spectrometer in an ultra high vacuum system" to change the evaporated particle mass at a target which is evaporated by means of an electron beam, by changing the voltage applied to a so-called Wehnelt electrode in the system.

A Wehnelt electrode is essentially an electrode with an aperture through which the electron beam passes. If its electrical potential is changed, the passing electrons are subjected to a more or less radially acting force and the bundeling of the electron beam is changed. The electrons, however, are simultaneously accelerated or decelerated before passing through the electrode ring, depending on the applied Wehnelt potential. When decelerated, a corresponding percentage of the emitted electrons is reflected back to the emission electrode.

Therefore by changing the potential of the Wehnelt electrode the beam bundeling as well as the mass current of the beam is changed.

If the effect of a positive potential applied to the Wehnelt electrode is considered, for example, it is clear that the beam would be widened radially, but that simultaneously the beam mass current is increased through axial acceleration forces in the vicinity of the Wehnelt electrode.

The incident electron density per unit area on the target material is decreased, however, by the widening of the beam, leading to a decrease in the particle mass evaporated from the target, per unit time.

On the other hand, when the Wehnelt voltage of the electron beam mass current is increased, this obviously increases the electron density per unit area on the target. Increased density also increases the particle mass removed per unit time from the target material.

By changing the Wehnelt voltage, two contrary effects with respect to particle mass removal are thus necessarily experienced simultaneously. Although the transmission characteristic of changes in the beam bundeling with respect to Wehnelt voltage and beam mass current with respect to voltage are different, so that the effective end result always leads to a change in the evaporated particle mass, the total transmission between evaporated particle mass and applied Wehnelt voltage is not linear and the steepness of the regulating characteristic is only satisfactory in a relatively small regulating range. The utilizable approximately linear regulating range is relatively small. Due to its nonlinearity, this approach thus can only be used within narrow limits.

SUMMARY OF THE INVENTION

The present invention provides a control method of the initially stated type in which the disadvantage of slowness relative to driving the thermal emission electrode is significantly improved with no additional expenditures on complexity for dwell time controls. The invention is realized by using a Wehnelt voltage with low expenditures but with a significantly extended utilizable regulating range.

Accordingly, an object of the present invention is to provide a method for the control of particle mass which is evaporated per unit time from a target, by a particle beam, in particular an electron beam which is driven as a mass current and strikes the target at an impingement area, comprising varying the extent of the impingement area of the beam on the target in a manner which is decoupled from the mass current and varying the position of the impingement area in a manner which is decoupled from the varying of the extent of the impingement area and from the mass current of the beam.

If, for the control of the evaporated particle mass, the extent of the impingement area of the particle beam on the target object, is varied exclusively, then the temperature at the target changes with the extent of this impingement area, and the particle mass evaporated from the target per unit time changes with the temperature.

With the stated control method for the evaporated particle mass per unit time according to the invention, the possibility arises for controlling the particle mass by varying the extent of the impingement area. This creates a regulating method, which, due to its high regulating steepness and good linearizability over a large regulating range, lacks inertia and operates stably in the regulating sense, up to very high frequencies in the kHz range.

Besides the control of the particle mass evaporated in the above described manner from a target, it is very often essential to be able to selectively detect the particle mass, even in the presence of other particles. Until now this was carried out by means of mass spectrometers. If two or more particle types were dominant, then either two or more mass spectrometers were provided in a spatial region above the target each tuned to the particle type of interest. Alternatively a single mass spectrometer was provided and the latter switched back and forth or switched successively for the detection of both or all particle types.

Building on the method of the invention initially stated, a further goal of the present invention is to create a method for the selective detection of the particle mass which impinges per unit time in a spatial region due to the evaporation of at least one target material with the aid of at least one particle beam, such as with the aid of a beam of charged particles, in particular an electron beam. This method is significantly less complex than prior known methods and yields better results i.e. with faster growth of a layer, a precise control of layer thickness and more homogeneous layers. Such improvement leads clearly to a significant increase in cost-effectiveness.

According to the invention, the extent of the impingement area of the particle beam on the target is modulated in a given manner, for example by means of a fixed carrier frequency. In general, particles in the spatial region of interest are detected and, through selective demodulation of the detected total particle mass, the fraction of the particles evaporated from the target is measured. With modulation at a fixed modulation frequency in which the impingement area contracts and expands in a pulsating manner, demodulation is carried out in a frequency-selective manner and at the fixed carrier frequency.

The particle mass evaporated per unit time is therein changed for example through the modulated size of the impingement area which corresponds to an amplitude modulation of the stated evaporated particle mass.

This approach is made possible through the above stated control of the impingement area extent alone and can be carrying out at high frequencies. This is required for a modulation according to the invention, where a detection method with a high degree of inertia is not acceptable.

With this method of detection, a method for the regulation of the particle mass using modulation/ demodulation as the measured regulating variable can be applied so that, for example, in the case of two targets of different materials being evaporated simultaneously, detection is possible by using a different modulation/ demodulation for each target. In this way, one of the regulating variables is detectable without using two or more mass spectrometers or one mass spectrometer being switched to detect different particles. If a single mass spectrometer is provided and switched for the detection of the two or more regulating variables, then a scanned regulating system results with a limit frequency corresponding to the change-over frequency that is possible at the mass spectrometer. This frequency is relatively low.

In place of one or several mass spectrometers now used, any non-mass-selective particle sensors, partially considerably simpler ones, can be employed, such as ionization cells.

According to another feature of the invention, it is entirely possible, with all stated methods for the control or regulation of the evaporated particle mass, to control the dwelling time and/or the mass current of the particle beam for slow changes. This is used, for example, in order to change the operating point of the particle beam.

In the above discussed methods for the selective detection of the particle mass as well as the method for the regulation of the particle mass, it is preferable to carry out the modulation without influencing the position or mass current of the beam. As compared to a modulation on the basis of a change in the Wehnelt electrode voltage, the invention offers significant advantages with respect to linearity and efficiency.

In the regulating method according to the invention, the control method of the invention is also used. That is, for the detection of the regulating variable both the stated modulation/demodulation method is used and also the extent of the impingement area is changed to effect the modulation in amplitude.

The above stated method for regulation of the particle mass with modulation/demodulation as the sensing method for the regulating variable, can also be used by application of a Wehnelt voltage for the modulation of the impingement area extent. Likewise with the above discussed method for the selective detection of the particle mass, modulation of the impingement area extent can potentially take place by modulation of the Wehnelt voltage.

Preferred embodiments of the method according to the invention are also oriented toward an applied magnetic bundeling control for a beam of monopolar charged particles. This aids in the decoupling effect of the invention, between the extent of the impingement area and the particle beam mass current as well as the impingement area position at the target.

A configuration according to the invention for the control of the evaporated particle mass is also disclosed, as well as a control circuit for its regulation and a measuring configuration for the selective measuring of the particle mass The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

DESCRIPTION OF THE PREFERRED EMBODIMENTS

Figure 1:
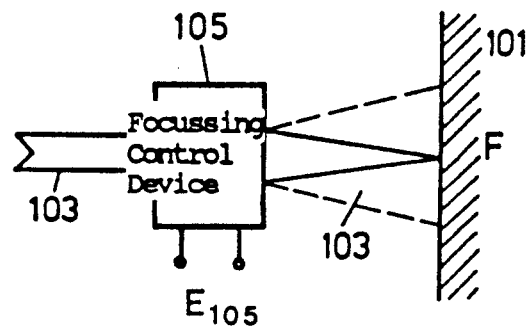
FIG. 1 is a schematic diagram of an apparatus for practicing the control method according to the invention.

FIG. 1 is a schematic configuration according to the invention for the control of particle mass removed per unit time, from a target 101. A particle beam 103, in particular an electron beam, is changed and controlled with respect to its bundeling at a focussing control device 105 having control input $E_{105}$, through which the beam passes.

A preferred structure of such a focussing control in which the position of the impingement area F (that is the position of the center of gravity or the area F) remains unchanged when changing the amount of bundeling, is described in connection with FIGS. 5 and following. One example is where the mass current of beam 103 is changed.

With a change of focussing i.e. with varying the size of impingement area F on target 101, the density of beam particles impinging per unit area is changed and therewith the thermal energy transmitted to the target 101 by impulses, is changed. The particle mass (not shown) evaporated from the target 101 also changes with the density of impinging particles. In this way, with focussing control, an essentially linear dependence is achieved which can be linearizable in a first approximation between one control parameter, namely the control signal at input $E_{105}$ and the particle mass evaporated from target 101. Further beam parameters are not decisively influenced, such as the stated mass current and the position of the impingement area F on the target 101.

Figure 5:
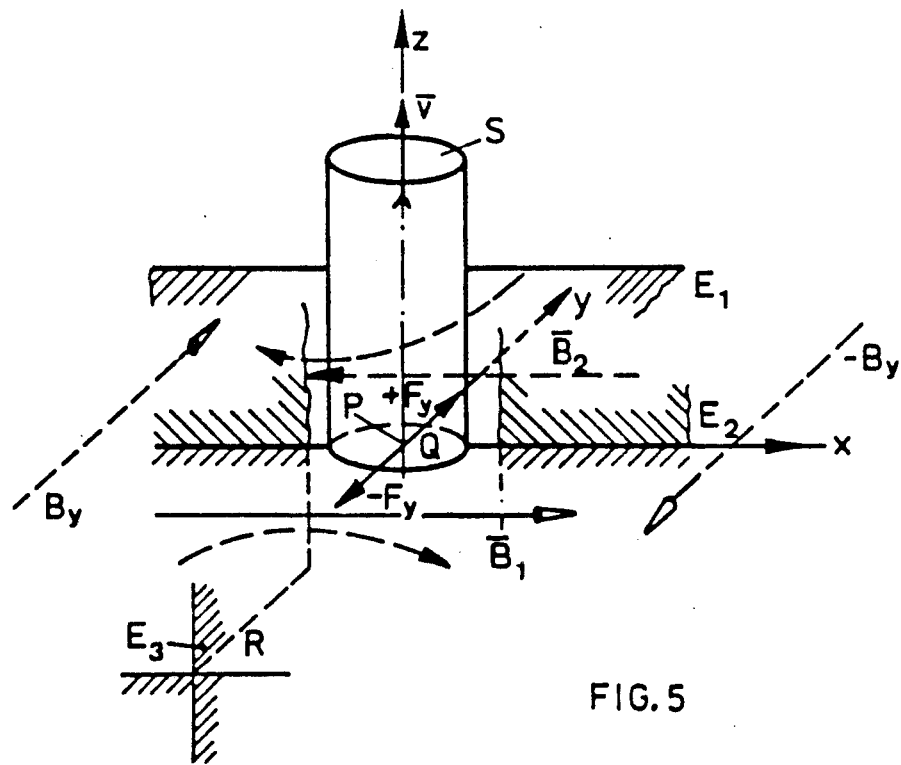
FIG. 5 is a representation of a preferred method for changing the extent of a particle beam, such as an electron beam, in the methods or configurations according to FIG. 1 to 4.

Since the focussing change at a particle beam 103, in particular an electron beam, can take place very rapidly, the frequency response is given primarily through the structure of the focussing control 105 and allows, with lowpass characteristic, control frequencies up to a few kHz in the structure according to FIG. 5 and following.

Consequently the procedure represented schematically in FIG. 1 is highly suitable as a control method in a control circuit for the particle mass evaporated from the target 101.

Figure 2:
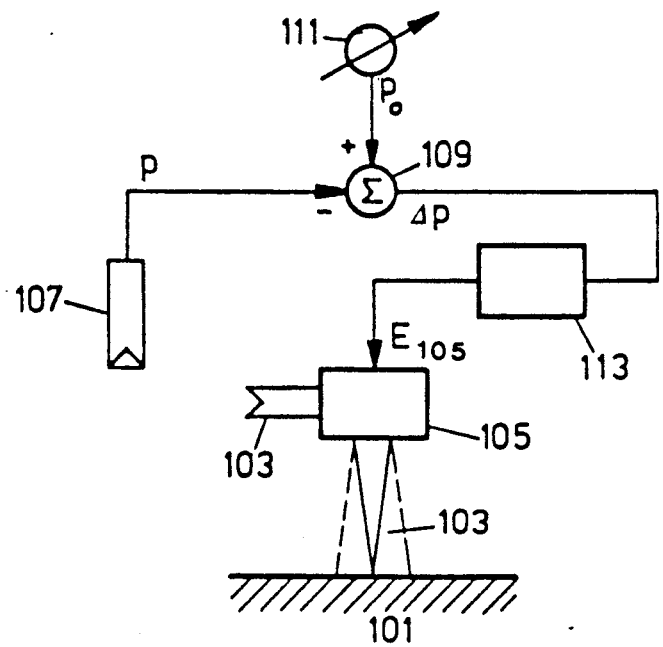
FIG. 2 is a schematic diagram of a control circuit according to the invention in which the control method of FIG. 1 is used.

This is shown schematically in FIG. 2. In a given spatial region, a particle detector 107 is used as a regulating variable sensor. For example an ionization cell (ion gauge) is provided and detects the particle mass p occurring in this spatial region and evaporated from the target 101. The measured regulating variable signal corresponding to the particle mass p is compared at a difference unit or comparator 109 with a nominal value $p_0$ which is adjustable at a variable source 111. The difference $\Delta p$ is supplied as a regulating difference, via a regulator 113 for optimizing the control circuit frequency response of the focussing control 105 explained in conjunction with FIG. 1. Therewith the focussing control is applied as a final control element in the control circuit shown in FIG. 2.

Figure 3:
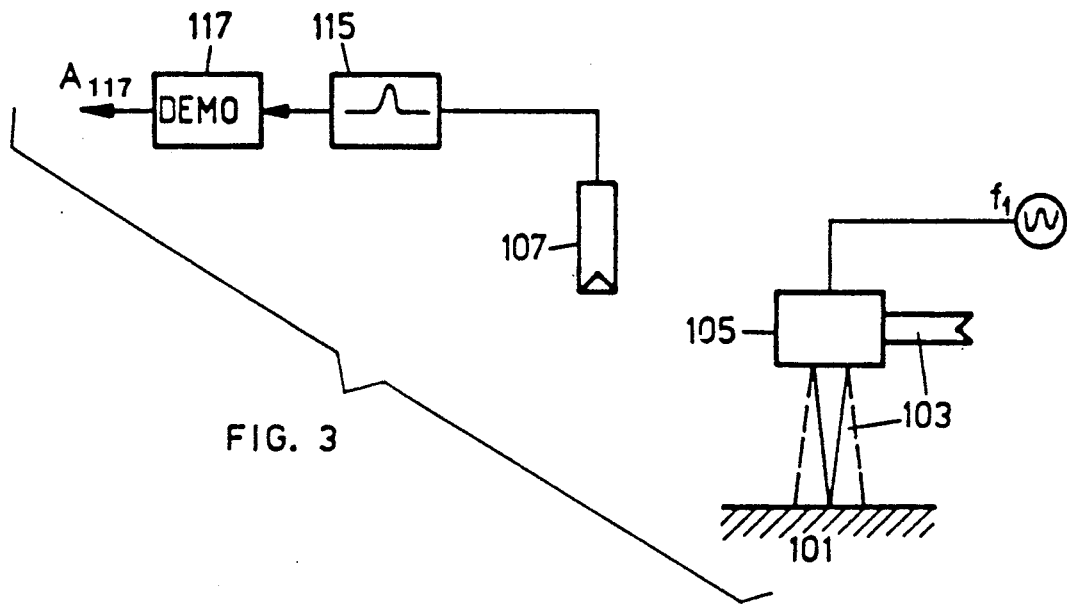
FIG. 3 is a schematic diagram of a measuring method according to the invention for an evaporated particle mass, in which the article mass removed is modulated in a given manner, by controlling the area of impingement for a particle beam, such as an electron beam, preferably with a control configuration or according to the control method of FIG. 1.

In FIG. 3 a method or a device for the selective detection of a particle mass in a spatial region is shown in which, apart from the particles to be detected, others are present, such as for example in a vacuum coating process where coating particles and inert gas particles are present. Fundamentally the particle mass removed from the target 101 is modulated in time, for example, the removal rate is varied in time according to a sine function with a given frequency $f_1$. With such modulation, a particle detector 107 is provided in the given spatial region. The detector need not be particle-selective per se, since it may detect a particle mass comprising a stationary component corresponding to the component of particles which are not of interest, and a component whose accumulating mass varies sinusoidally in time (which is of interest). Through subsequent filtering by means of a bandpass filter 115, tuned to the frequency $f_1$, as well as demodulation in a demodulation unit 117 wherein for example from the signal with the frequency $f_1$ the amplitude value is determined and stationarily output, a signal $A_{117}$ is obtained which corresponds to the particle mass of the particles of interest accumulating at detector 107.

Although a Wehnelt voltage modulation with the frequency $f_1$ can also be used for the control of the electron beam which in turn is used for evaporation, and therein no deviation from the inventive concept takes place, the focussing control 105 is preferred the final control element which modulates the evaporated particle mass in time at a frequency $f_1$, as described in conjunction with FIG. 1.

By applying this simple measuring method, expensive mass spectrometers can be replaced since particle selectivity takes place on the basis of the frequency criterion. In such a simple measuring method, moreover, drift and/or calibration problems can be controlled more readily.

Figure 4:
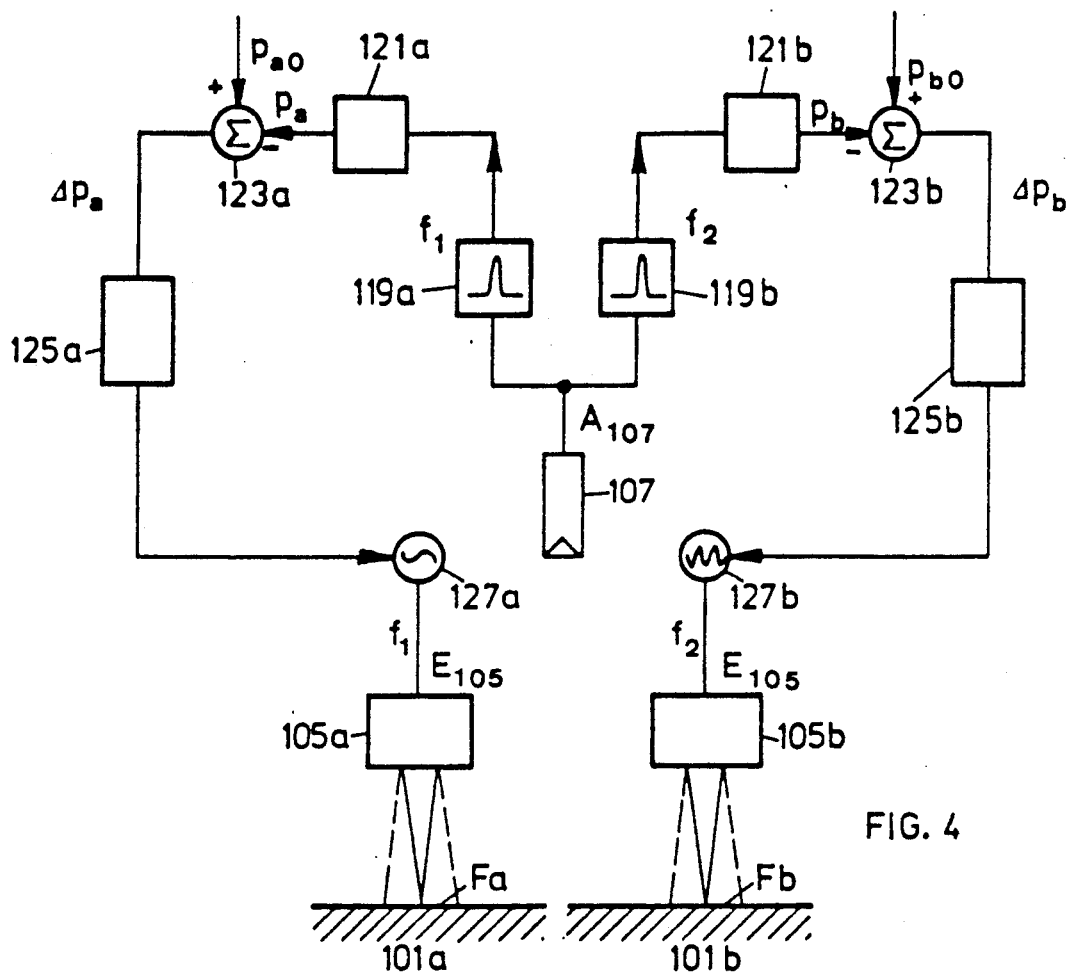
FIG. 4 is a schematic diagram of an apparatus for the regulation of two particle masses which are removed simultaneously and, in which regulating variable detection takes place selectively due to the given modulation of the particle mass and corresponding demodulation, preferably with an extent modulation and, according to FIG. 1, the extent of the particle beam impingement area being used as a regulating method for particle mass.

In FIG. 4, and building on the previous explanations, a selective control circuit is shown. The particle masses evaporated from the targets 101a and 101b are modulated in time with the frequencies $f_1$ and $f_2$. A particle detector 107 disposed in a predetermined spatial region, detects the particle mass given off by the target 101a as well as that evaporated from the target 101b. Its output signal $A_{107}$ is filtered selectively at the frequencies $f_1$ and $f_2$. The output signals of the filter unit 119 and 119 are supplied to demodulation units 121a and 121b. The output signals of the demodulation n units 121a and 121b correspond to the particular selective particle quantities $p_a$ and $p_b$ measured with the detector 107. Both are supplied to a measured regulating variable signal of a difference unit 123a or 123b respectively where they are compared as in FIG. 2, with a variable nominal value $p_{a0}$ or $p_{b0}$. The resulting regulating difference $\Delta p_a$ or $\Delta p_b$ is supplied via an appropriately dimensioned controller 125a or 125b respectively to the provided final control element for the particular particle mass. The modulation frequencies are given preferably in fixed ratios to avoid problems of aliasing.

Preferably and as shown, the modulation of the removed particle mass in time at both targets 101a and 101b is realized by means of a focussing control as explained in conjunction with FIG. 1. The modulation is driven at the appropriate inputs $E_{105}$ by means of a modulation generator 127a or 127b, respectively. But the same focussing controls 105a and 105b are also applied as final control elements in these control circuits, in that at the output the controller 125a or 125b act upon the modulation generators 127a and 127b and thereon adjust for example the modulation amplitude.

With constant frequency $f_1$ and $f_2$, and by driving the modulation with which the corresponding impingement areas $F_a$ or $F_b$ are modulated in time, the particular evaporated particle masses $p_a$ or $p_b$ averaged over time are adjusted until the regulating variable values determined with the detector 107 and the particular frequency-selective succeeding stages correspond to the preset nominal value $p_{a0}$ or $p_{b0}$.

With reference to the following Figures now a preferred focussing control for use with the configuration or the method explained in conjunction with FIGS. 1 to 4 will be explained.

FIG. 5 represents the spatial configuration of a beam of monopolar, charged particles S having a transverse plane $E_1$ and a beam penetration area Q. Furthermore the direction R is drawn along which the extent of the beam penetration area Q is to be varied in a controlled manner as well as the plane $E_2$ which is perpendicular to the plane $E_1$ and to the direction R corresponding to the Y-axis in the XYZ system of coordinates. According to the invention now on both sides of the plane $E_2$ a flux density field e,ovs/B/ is applied with essentially parallel field course wherein on the one side of plane $E_2$ the flux density field has the one, on the other side the other polarity. Through the two flux density fields e,ovs/B/ $_1$ and e,ovs/B/ $_2$ applied according to the invention on the surface charge in the beam penetration area Q, on the side of plane $E_2$ a force $-F_y$ and on the other side of this plane a force $F_y$ is exerted so that depending on the polarities of the two flux density fields e,ovs/B/ $_1$ and e,ovs/B/ $_2$ the forces act on the stated area Q in a manner either compressing or expanding the beam.

If the fields e,ovs/B/ $_1$ and e,ovs/B/ $_2$ along the X extent of the area Q have at least essentially no curvature, the charge carriers in the area Q essentially do not experience any forces in the X direction and with the driving of the field strength, i.e. the magnitude of vectors e,ovs/B/ $_1$ or e,ovs/B/ $_2$ and their polarities, the extent of the surface charge Q in the Y direction is driven, which with constant extent in the X direction if, as stated, at least in this area the field curvature is negligible, leads to the fact that the charge density (surface charge) is decreases through enlargement of the area Q in the Y direction.

If, however, as drawn in dashed lines, the flux density fields e,ovs/B/ $_1$ and e,ovs/B/ $_2$ applied according to the invention in the area of the extent of the penetration area Q are generated with curvatures, then components $B_y$ or $-B_y$ result which are perpendicular to plane $E_2$, as drawn. It becomes evident that, in this case, when the penetration area Q is expanded in the Y direction, it is also simultaneously compressed in the X direction, and conversely.

However, in order to achieve independence from area expansion changes in the one direction Y, from such changes in the other direction X, in a preferred embodiment of the invention the condition of parallelism of the two flux density fields e,ovs/B/ $_1$ and e,ovs/B/ $_2$, is fulfilled at least over an area which corresponds to the extent of the penetration area Q. Thereby with controlled changes of the flux density fields e,ovs/B/ $_1$ and e,ovs/B/ $_2$ no transverse components of these fields in the Y direction originate. The charges in the area Q also are only acted upon by forces in the Y direction.

In judging whether or not the beam also experiences a deflection in its bundeling control, it must first be defined at what point a change of the bundeling is to be referred to as beam reflection. A charge within the beam penetration area Q does not experience any force there—with which the path of such a charge or the corresponding particle remains uninfluenced—where the flux density fields e,ovs/B/ $_1$, e,ovs/B/ $_2$ applied according to the invention cancel each other. On the other hand, a shift in the position of the center of gravity of all charges occurring currently in the plane $E_1$ can be called a deflection. The position of the charge center of gravity in the area considered instantaneously, does not change if the two flux density fields e,ovs/B/$_1$ and e,ovs/B/$_2$ are applied symmetrically on sides of the second plane E$_2$ and if this symmetry is maintained during controlled variation of the fields.

Figure 6:
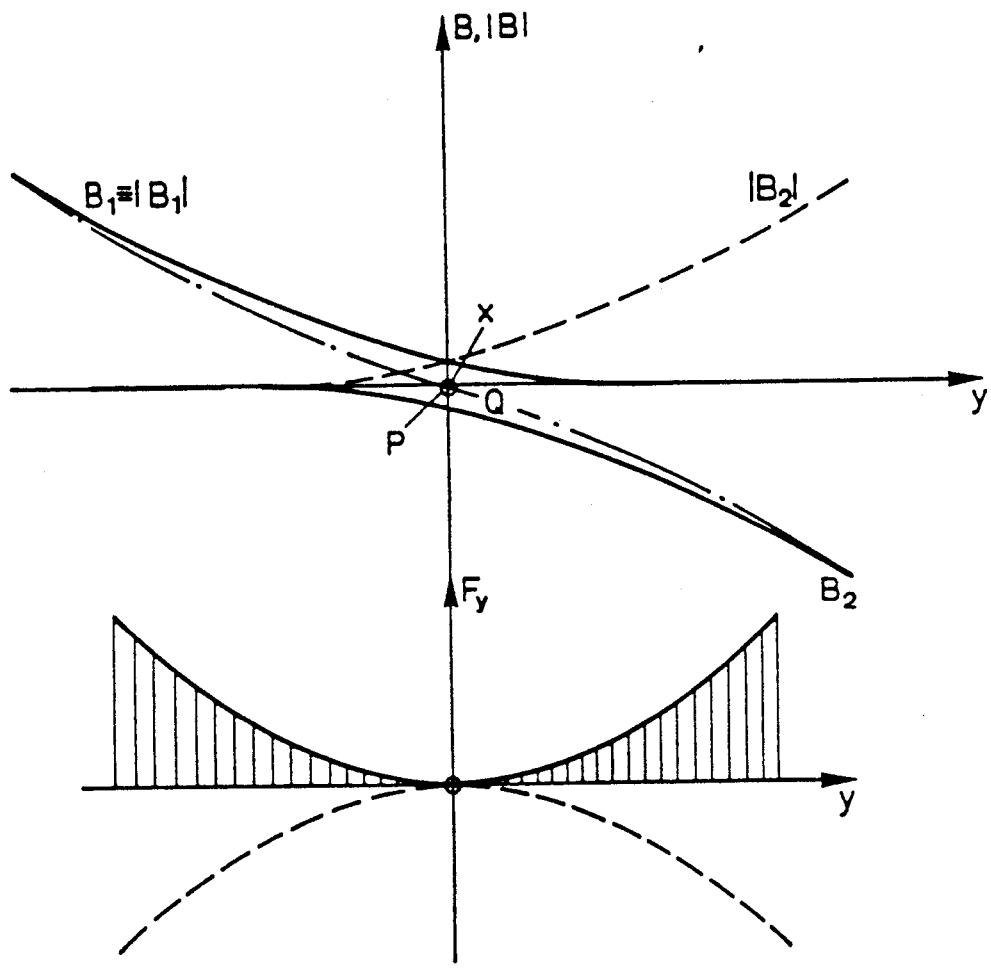
FIG. 6 is a representation of a driven flux density field relation according to the invention, when viewing the fields according to FIG. 5 in the X direction.

This will be explained in conjunction with FIG. 6. In FIG. 6, above the Y axis on which the extent of the penetration area Q is plotted, the effective value e,ovs/B/$_1$, e,ovs/B/$_2$ of the two flux density fields e,ovs/B/$_1$ and e,ovs/B/$_2$ is plotted. The course of these values is represented purely qualitatively and corresponds approximately to the decreasing course with increasing distance from a generated magnetic dipole. If plane E$_2$ is placed in the charge center of gravity P of the surface charge over the area Q, and if this charge center of gravity P is varied in the direction Y through the flux density fields applied according to the invention, then these two fields B$_1$ and B$_2$ are so applied that they cancel each other in the plane E$_2$. The resulting course is represented qualitatively in dot-dash lines. If furthermore the two flux density fields e,ovs/B/$_1$ and e,ovs/B/$_2$ are layed out so that their magnitudes |B$_1$|, |B$_2$| are symmetrical to plane E$_2$ as shown in dashed lines, and this condition is maintained even when changing the fields, then the fields, when viewed locally, cancel at site P, and forces of equal magnitude act on the surface charge on both sides of plane E$_2$. With such forces, charges in the area Q pass on paths which are symmetrically changed with respect to plane E$_2$. Thereby the charge center of gravity remains at site P, and no deflection of the beam takes place. The tub-like distribution of the generated forces F$_y$, when polarity changes, is represented qualitatively in FIG. 6 by a dashed line.

It is known to direct an electron beam used in a vacuum installation, along a curved path from the beam generator to the material to be evaporated, and specifically to partially deflect the beams by significantly more than 180°, up to 270° or even more. In order to be able to realize this, a magnetic flux density field must act along extended sections of the beam path. This frequently requires the flux density to be applied close to the beam generator to achieve the desired strong deflection. Consequently, it is in many cases not possible, to achieve the stated deflection and to effect a bundeling control of the type here under discussion. This is because of the need for compact construction and because it is not possible to carry out the deflection in a section of the path so far removed from the bundeling control without causing changes in the bundeling control.

As is evident in FIG. 6, deflection measures are used to change the position of the area the corresponding surface charges occur in changing relations to the field applied according to the invention and consequently changes in bundeling also occur. In view of these requirements it is furthermore frequently essential to be able to deflect the beam at least in one direction without changing the focussing conditions in the process. This is, on viewing FIG. 5, readily possible when proceeding according to the present invention.

With the relations drawn in FIG. 5, of the two flux density fields e,ovs/B/$_1$ and e,ovs/B/$_2$ applied according to the invention it is possible to shift the beam and consequently its penetration area Q in the direction X without bundeling changes in the Y direction occurring Accordingly, a further preferred embodiment of the method according to the invention consists in constantly applying the fields on both sides of the second plane over an area significantly longer than the extent of the penetration area Q and specifically in the sense that the field relations in the stated area and successively in the X or −X direction, remain unchanged. If now, for example, large-angle beam deflection is to be carried out in the plane E$_2$, it can be started already before the bundeling forces are applied according to the invention and also be changed for varying the impingement position, without thereby influencing the bundeling adjustment.

If one views the course of the magnitudes |B$_1$|, |B$_2$| of the flux density fields applied according to FIG. 6, it becomes evident that a three-dimensional region is set up with a valley extending in the X direction and rising on both sides.

In some cases it is desired to drive the bundeling of the beam in several, such as two, directions which are perpendicular to each other. The driving effects may be dependent on each other or independent from each other, i.e. basically and according to FIG. 5 in the Y as well as also in the X direction. To this end it is suggested that with respect to a third plane, in FIG. 5 plane E$_3$, which is perpendicular to the first plane E$_1$ and to the second E$_2$, and which contains the direction R, on both sides a second flux density field is applied, with bilaterally parallel vector components of reverse polarity and preferably, of symmetrical magnitudes with respect to the third plane. Such a second flux density field corresponds to the fields drawn in FIG. 5 in dashed lines at B$_y$ and −B$_y$ which are generated if, as was explained above, the first flux density field e,ovs/B/$_1$ or e,ovs/B/$_2$, as likewise drawn in FIG. 5 in dashed lines, is curved.

Figure 7:
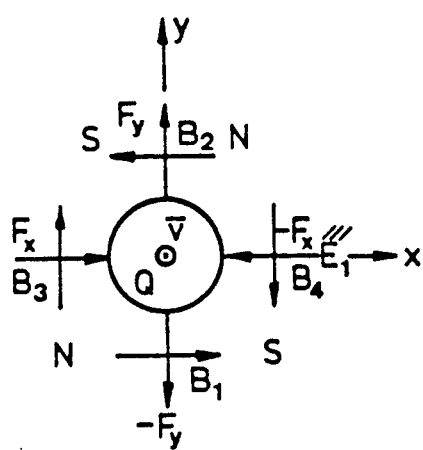
FIG. 7 is a schematic top view of the conditions according to FIG. 5 on applying two flux density fields that are oriented at right angles to each other in a first polarity relation according to the invention.

In FIG. 7, a top view onto a representation which is analogous to FIG. 5, the first magnetic flux density field with the components e,ovs/B/$_1$ and e,ovs/B/$_2$ and according to FIG. 5 is drawn, as well as the second flux density field which is perpendicular to the first field, with the components e,ovs/B/$_3$ and e,ovs/B/$_4$. In FIG. 7, in a circle is followed around the penetration area Q, the polarities of the flux density fields B alternate. Therewith originate the force conditions also drawn in FIG. 7, i.e. if the polarity conditions are retained, in the one direction X or Y, the area Q is compressed or expanded and in the other, Y or X, expanded or compressed This field-polarity arrangement or constellation, can readily be realized by providing two magnetic dipoles as is evident from the pole distribution around the area Q.

Figure 8:
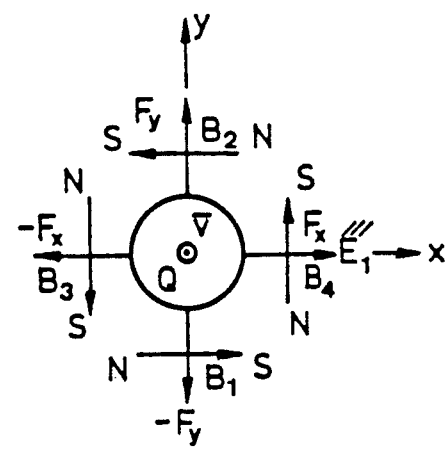
FIG. 8 is a representation analogous to FIG. 7 with fields in a second polarity relation according to the invention.

In FIG. 8 a further layout of the flux density fields is shown in a representation which is analogous to FIG. 7. Here, when following a circle around the penetration area Q, the polarities of the flux density field component e,ovs/B/$_1$ to e,ovs/B/$_4$ do not alternate. In this constellation of the polarities all forces effected by the field components act, as drawn, either toward the outside or toward the inside, whereby a centrally-symmetrical expansion or concentration of the penetration area Q becomes possible. This polarity constellation cannot, as can readily be seen by the magnetic poles, be realized by two magnetic dipoles, but further measures must be taken to this end as will be explained in conjunction with FIG. 10.

If through the second applied flux density field with the components e,ovs/B/$_3$ and e,ovs/B/$_4$ in both polarity distributions according to FIGS. 7 and 8, only the bundeling of the beam is to be influenced corresponding to a change of its penetration area Q in the direction X or −X, then this second flux density field, again at least over a length corresponding to the extent of the area Q in the Y direction, is layed out parallel. With respect to the preferred symmetrical layout of the magnitudes of the second applied flux density field, the considerations made in conjunction with FIG. 6 for the first flux density field apply. This is a requirement if the aim is not to shift the charge center of gravity of the instantaneous surface charges in the area Q.

If the second applied flux density field is also applied so that the fields on both sides of the third plane are constant over an area significantly longer than the extent of the penetration area Q, then, according to FIGS. 7 and 8, the change of the bundeling effected in the X direction through the second flux density field with the components e,ovs/B/$_3$ and e,ovs/B/$_4$ is not influenced by an excursion of the beam in the Y direction which effects a spatial shift of the penetration area Q. The conditions that the bundeling in the Y direction, brought about through the first flux density field e.ovs/B/$_1$ and e,ovs/B/$_2$ is not influenced by a shift of the area Q or of the beam in the X direction, and that the bundeling in the X direction brought about by the second flux density field with the components $B_3$ and $B_4$ is not influenced by a shift of the penetration area Q and consequently of the beam in the Y direction, is desired in some cases in order to more readily carry out compensation of focussing control fields at an operating point of the beam, which beam is subsequently deflected during operation in the X and Y direction.

Figure 9A:
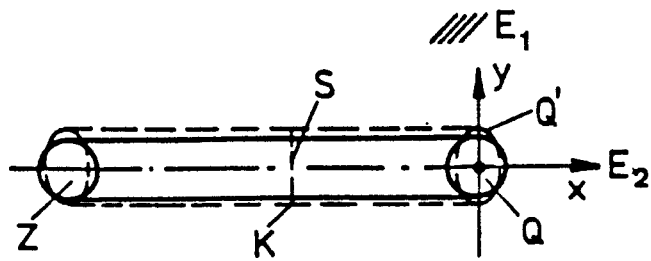
FIG. 9a is a schematic top view of a strongly deflected beam formed under the conditions of FIG. 5, with a bundeling change of the beam by means of fields according to FIG. 7.
Figure 9B:
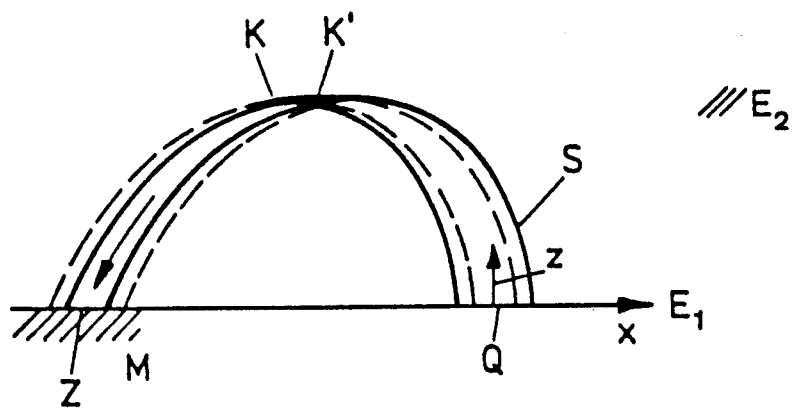
FIG. 9b is a side elevational view of the beam deflected by a large angle and according to conditions which are changing in the Y direction and according to FIG. 5, with changes in bundeling being shown.

The polarity distribution according to FIG. 7 can have significant advantages in certain cases. As has been stated, in some cases it is customary for electron beams to be deflected strongly in one plane. FIG. 9a shows a layout of the first flux density field with the components $B_1$ and $B_2$, according to FIG. 5 and according to the invention for deflecting a beam S in the second plane $E_2$. In FIG. 9b (a side view), the course of the beam S in the plane $E_2$ is shown. In such a deflection, as is also known for example from U.S. Pat. 4,064,352, a region K is formed at which the beam is constricted. In top view, i.e. in the deflection plane $E_2$, in many instances such constriction does not occur.

These conditions are not optimally used in the procedure according to FIG. 7. If according to FIG. 7 with the first flux density field e,ovs/B/$_1$, e,ovs/B/$_2$ an expansion of the cross-sectional area Q takes place and consequently of the beam expands in the Y direction, the conditions shown in FIG. 9a in dashed lines then exist. Simultaneously with the second applied flux density field with the components e,ovs/B/$_3$ and e,ovs/B/$_4$, if necessary directly coupled with the first flux density field, a compression of the penetration area Q can be carried out. Therein result the cross-sectional areas Q' drawn in FIG. 9a in dashed lines.

When considering FIG. 9b, however, a shift of the constriction region K for example to the area K' results in the reduction of the penetration area Q in the X direction, i.e. closer to the beam source. This corresponds to the shift of a focal point closer to the source. Due to this, the material M to be evaporated at the target, as viewed in direction X or in the plane $E_2$, is subject to an inverse effect, i.e if in this direction the penetration area Q is compressed, the impingement area on the material M due to the shift of the constriction area K' is enlarged. Consequently the advantage of the polarity choice shown in FIG. 7 is manifest. In particular in the case of strong deflection of the particular electron beam S by more than 90°, and in particular by more than 180° and, precisely through this polarity choice, the impingement area Z in FIG. 9 is radially expanded or compressed in all directions. The resulting qualitative beam distribution is shown in FIG. 9b also in dashed lines. The position of the constriction area in the sense of an operating point about which this position is changed by varying beam bundeling, is fundamentally determined through the beam generator as well as the electron-optical measures for the beam formation.

As will be explained, with the choice of a polarity configuration according to FIG. 8, the first flux density field e,ovs/B/$_1$, e,ovs/B/$_2$, and the second flux density field e,ovs/B/$_3$, e,ovs/B/$_4$ are applied in an offset manner along the beam axis. In the embodiment according to FIG. 7, the two flux density fields are essentially applied in the same axis, specifically the first plane $E_1$.

Figure 10:
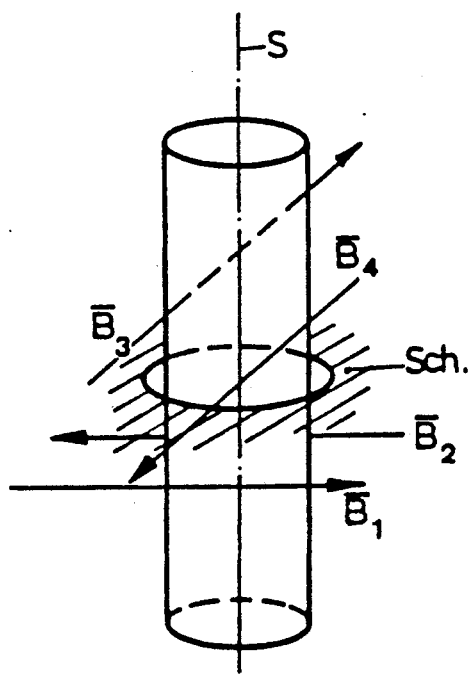
FIG. 10 is a schematic diagram of two orthogonal flux density fields which are offset in the propagation direction of the beam.

If in the polarity configuration according to FIG. 7 or FIG. 8, the first flux density field e,ovs/B/$_1$, e,ovs/B/$_2$ is to be driven independently of the second e,ovs/B/$_3$, e,ovs/B/$_4$ and conversely, then according to FIG. 10 the first flux density field e,ovs/B/$_1$, e,ovs/B/$_2$ is applied along the propagation direction of the beam S but offset from the second flux density field e,ovs/B/$_3$, e,ovs/B/$_4$. Preferably between the two flux density fields a magnetic shielding Sch. is provided so that the two fields do not influence each other. This procedure is indicated in any case with the polarity choice according to FIG. 8. However, this configuration can also take place through time-staggered generation of the fields e,ovs/B/$_1$, e,ovs/B/$_2$, on the one hand, and e,ovs/B/$_3$, e,ovs/B/$_4$, on the other hand, in the plane $E_1$.

Figure 11:
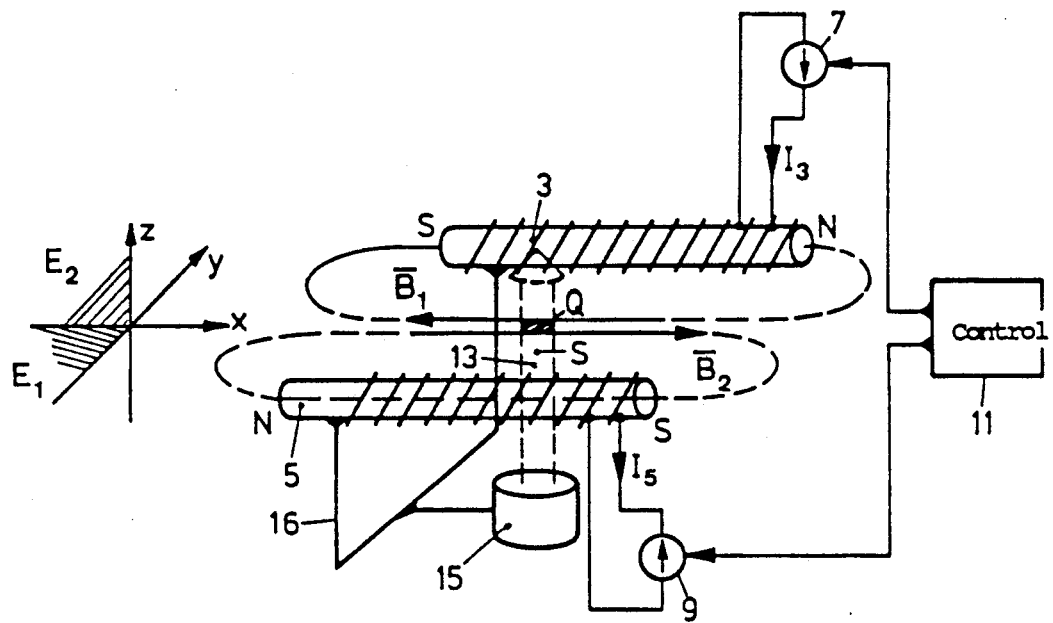
FIG. 11 is a schematic diagram of a configuration according to the invention for the realization of the conditions represented in FIGS. 5 to 9b.

FIG. 11 schematically represents an example of a configuration for the control of beam bundeling according to the invention. It comprises a magnet configuration fundamentally implemented so that the vector components of the flux density field generated by the magnet configuration, as was explained in conjunction with FIGS. 5 and 6, are generated. Preferably the magnet configuration is formed by a pair of dipoles 3 and 5 which are preferably formed by electromagnet configurations, each fed via current sources 7 or 9 driven by a control device 11. Dipoles 3 and 5 for the operating point settings of the bundeling may also be formed by permanent magnets or can comprise permanent magnets. The beam of monopolar charged particles, in particular of elections S, is sent through an area 13 . To this end, with respect to the dipole configuration of dipoles 3 and 5, the position of a beam generator 15, which is schematically represented in FIG. 11, is defined or definable with the aid of a securing arrangement. A corresponding securement of dipoles 3, 5 and the beam generator 15 is shown schematically at 16. As can be seen in FIG. 11, the components e,ovs/B/$_1$ and e,ovs/B/$_2$ of the flux density field explained in FIG. 5 are generated through the two dipoles 3 and 5, in principle, and are layed out with respect to area 13 for the beam S, as was explained in conjunction with FIG. 5, with respect to beam S. This is the goal in a preferred embodiment of the invention, to implement the course of the flux density field $B_1$, $B_2$ essentially parallel in an area corresponding at least to the diameter of the beam penetration area Q formed by the beam S transiting the beam area 13. As can readily be seen in FIG. 11 this is achieved in a simple manner where the length of the dipoles 3 or 5, viewed in the X direction, is implemented to be significantly greater than the extent of the cross-sectional area Q viewed in the X direction of the beam S transiting through the provided beam area 13.

With the aid of the control device 11, the flux density field components e,ovs/B/ $_1$ and e,ovs/B/ $_2$ on both sides of the penetration area 13 for the beam S, i.e. on both sides of plane E$_2$, are driven so that the magnitudes of the flux density fields on both sides of this plane E$_2$ are symmetrical with respect to the plane. According to the explanation of FIG. 6, thus, the change of the beam penetration area Q driven with the flux density fields e,ovs/B/ $_1$ and e,ovs/B/ $_2$ in the Y direction, doe not change the charge center of gravity of the surface charge existing instantaneously in the area Q. The drive of the flux density fields e,ovs/B/ $_1$ and e,ovs/B/ $_2$ in such manner that this condition is fulfilled takes place depending on the geometric orientation of the two magnetic dipole 3 and 5 with respect to the plane E$_1$, wherein the penetration area Q of the beam S is to be influenced selectively through the appropriate choice or drive of the currents generated by means of the current sources 7 and 9.

So that the control effected through the magnet configurations 3 and 5 of the beam penetration area Q of the beam transiting through the area 13 over a relatively large distance viewed in the X direction, becomes independent of the position of the beam S in the X direction, the magnetic field configuration preferably comprising the two dipoles 3 and 5, further, is layed out so that the course of the flux density field e,ovs/B/ $_1$ and e,ovs/B/ $_2$ on both sides of the stated second plane E$_2$ is constant over a large area which is significantly longer than the extent of the penetration area Q of beam S. This is, in turn, achieved through a correspondingly long extent of the magnetic dipoles 3 or 5 as viewed in the X direction.

Although it is entirely possible to generate the flux density field course according to FIG. 5 through spatial superposition of several flux density fields, as shown in FIG. 11, this field is preferably generated by means of a magnet configuration having two magnetic dipoles, namely the dipoles 3 and 5, disposed essentially parallel to the second plane, two dipoles initially do not need to lie in plane E$_1$ and likewise do not need to be symmetrical with respect to plane E$_2$. Within broad limits the geometric relative position of the two dipoles 3 and 5 with respect to the area of action, namely the intersection between the planes E$_1$ and E$_2$, can be selected freely and the flux density field course according to the invention at the area of action can be effected through appropriate electrical drive of the magnet configuration.

Complex spatial field superpositions may also be needed, however, and must be considered. If not required for other conditions, for example constructional boundary conditions, the two magnetic dipoles, as shown in FIG. 11, will be placed essentially in the first plane E$_1$. Then the field conditions become simple and clear. In this case, the two dipoles 3 and 5, need not be symmetrical with respect to the second plane E$_2$ and it is obvious that an asymmetry can be compensated through an appropriate asymmetrical current supply by current sources 7 or 9, or asymmetrical windings on the electromagnets. Other boundary conditions, such as those of a constructional type with respect to the beam generator 15, demand other arrangement as shown in FIG. 11, where the magnetic dipoles in the first plane are disposed symmetrically with respect to the second plane.

Figure 12:
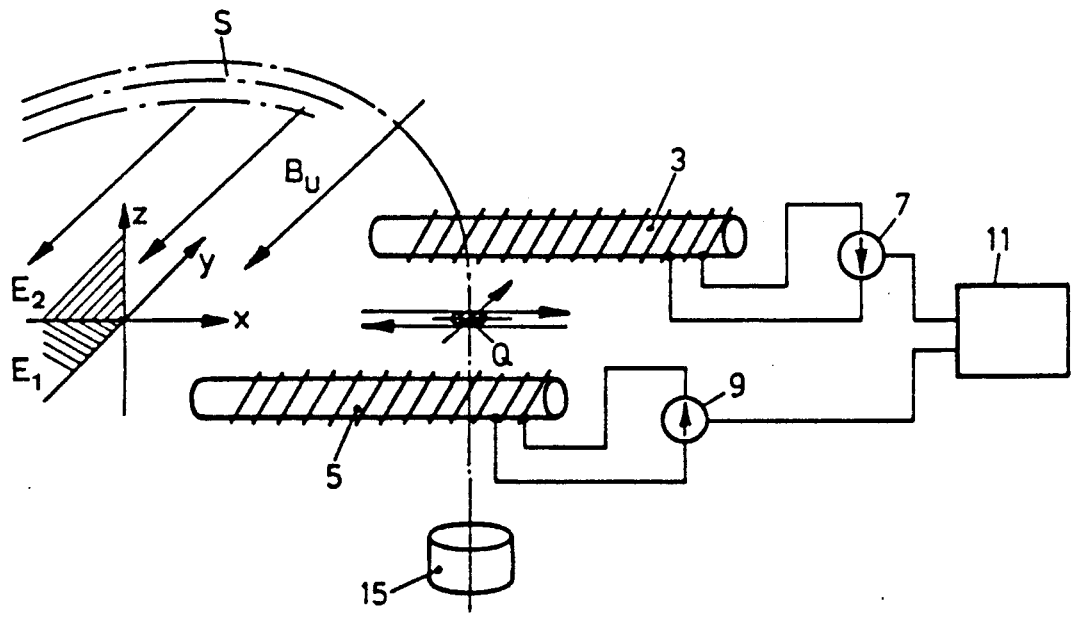
FIG. 12 is a view analogous to FIG. 11, with the provision of a deflection field effective over a wide space for the beam, for the generation of deflection conditions analogous to those represented in FIGS. 9a and 9b.

In FIG. 12, essential parts of the configuration of FIG. 11 are shown. As was explained, the bundeling control of the beam effected through the two dipoles 3 and 5 in the Y direction is, depending on the layout of the dipoles, in particular depending on its length, in the X direction to the greatest possible extent independent of the position of the beam in the X direction. If now, as is known from U.S. Pat. Nos. 4,064,352 or 3,420,977, the beam is subjected to a strong deflection, and specifically to such an extent, that already shortly after leaving the beam generator at 15 in FIG. 12, deflection forces must be exerted on the beam, in order to bring the beam onto target over reasonably short distances, it is suggested to carry out such a deflection essentially in the second plane.

This is shown in FIG. 12 wherein the detection device, for example according to U.S. Pat. No. 3,420,977, generates a deflection flux density field B$_U$ which according to FIG. 12 extends essentially in the Y direction. Thereby, the beam S, shown in dashed lines, is increasingly deflected and can experience a deflection up into the range of 270° or more. Since such a deflection device must become effective with the generation of the deflection field B$_U$ immediately after the beam generator 15 in order to deflect the beam as required over as short a distance is possible, at the bundeling control provided according to the invention, displacements of the beam S in the X direction must already be considered in particular also if the deflection is modulated, in order to displace the beam toward the target.

Since the effected control of the bundeling in the X direction is essentially independent of the position of the beam in this direction, the deflection therefore is preferably carried out in plane E$_2$.

FIGS. 7 and 8 as well as FIGS. 9a and 9b, disclose the condition in which, in addition to the stated first flux density field e,ovs/B/ $_1$, e,ovs/B/ $_2$ a second flux density field e,ovs/B/ $_3$, e,ovs/B/ $_4$ is applied perpendicularly to the first.

Figure 13:
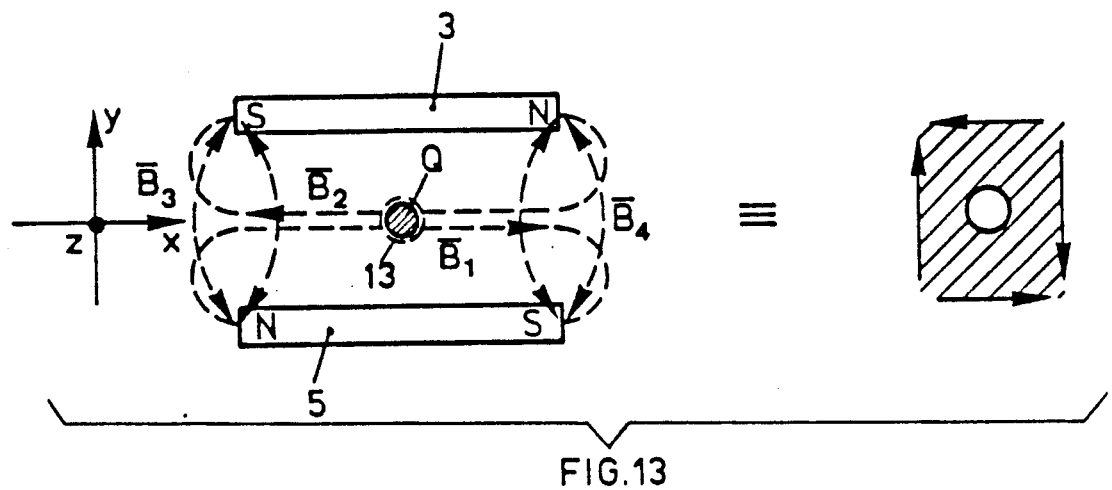
FIG. 13 is a schematic top view of a configuration according to those represented in FIGS. 11 or 12, for the generation of field conditions analogous to those represented in FIG. 7.

FIG. 13 is a schematic top view of a configuration with two dipoles 3 and 5 according to FIGS. 11 or 12. Depending on the distance of the two dipoles 3 and 5 viewed in the Y direction and with respect to their length in the X direction, and depending on the penetration area 13 for the beam S with its penetration area Q, effective flux density fields e,ovs/B/ $_3$ and e,ovs/B/ $_4$ are also generated, as shown schematically in FIG. 7. Consequently, through appropriate dimensioning of the configuration with the dipoles 3 and 5 the flux density field configuration according to FIG. 7 with the field polarity shown there is achieved directlY. The advantages with respect to the inversion of target areas and changes with respect to the change in penetration area discussed in conjunction with FIGS. 9a and 9b are thus achieved.

Fundamentally, the goal is to tune the magnet configuration, as shown for example in conjunction with FIGS. 11, 12 or 13, and the device, which can be for example the deflection device shown in FIG. 12, as well as a beam generator of known type, to each other so that a penetration area cross-section change in the area of the influence of the magnetic flux density to e,ovs/B/ $_1$ to e,ovs/B/ $_4$ effected through the magnet configuration with the dipoles 3 and 5, inversely effects a diameter change of a beam target area at least in one direction, as discussed in detail in conjunction with FIGS. 9a and 9b. This is achieved through the configuration according to FIG. 13 with a deflection device and a beam generator for generating a constriction area according to FIG. 9b. This is for a configuration having a device for beam generation as well as the type of electron-optical system (depending on the type of beam particles which forms at least one area of constriction of the beam, along the direction of propagation, as explained in conjunction with FIG. 9b.

Figure 14:
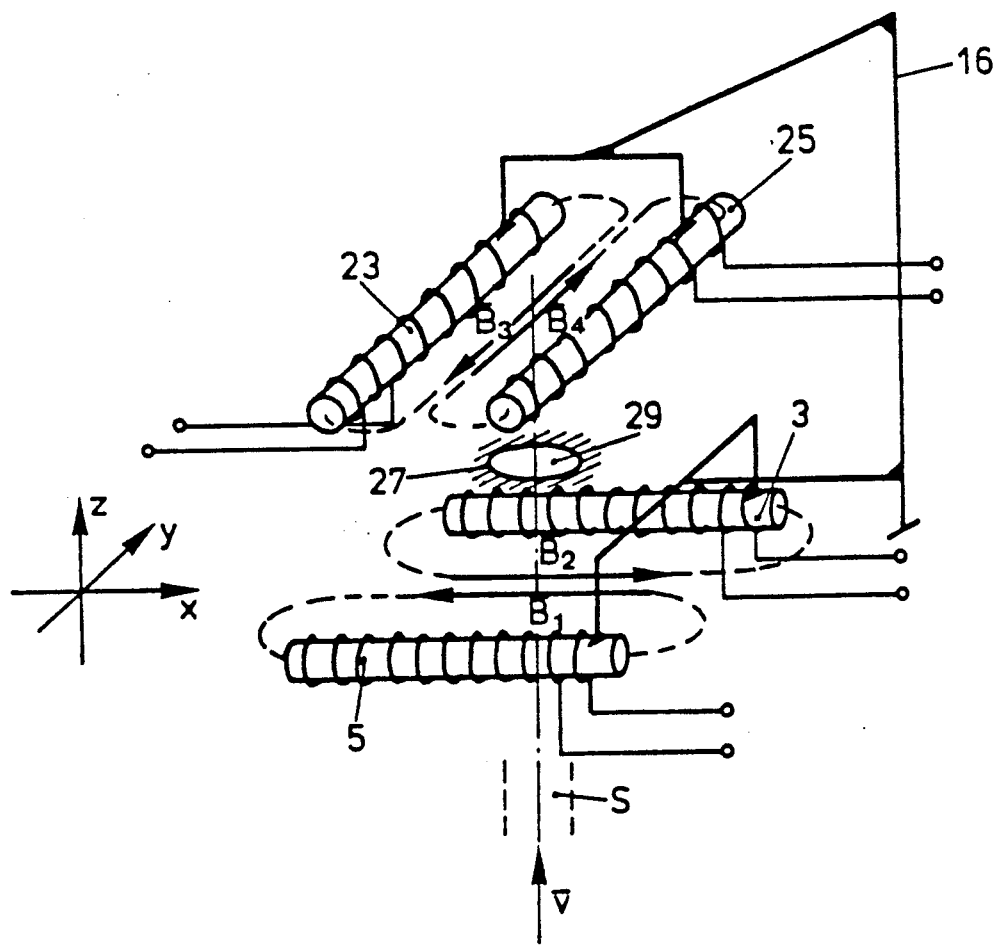
FIG. 14 is a schematic diagram of a configuration for the generation of orthogonal bundeling control fields according to FIGS. 7 and 8, and with axial field offset according to FIG. 10.

In FIG. 14 a magnet configuration is shown schematically which generates the flux density e,ovs/B/ $_1$, e,ovs/B/ $_2$ and the further perpendicular flux density e,ovs/B/ $_3$, e,ovs/B/ $_4$, independently of each other. To this end, the two dipoles 3, 5, are provided along the propagation direction for beam S, and, with respect to offset along the beam propagation direction, further dipoles 23 and 25 which drive the flux density field e,ovs/B/ $_3$, e,ovs/B/ $_4$ according to FIG. 8 or according to FIG. 7 are provided perpendicularly to the dipoles 3 and 5. By providing a magnetic shield 27 with a penetration opening 29 for the beam, the two flux density fields e,ovs/B/ $_1$, e,ovs/B/ $_2$ and e,ovs/B/ $_3$, e,ovs/B/ $_4$ driven independently of each other are largely decoupled from each other. In this manner it is possible to control the beam with respect to its bundeling, independently in the direction X as well as also in the direction Y. As shown schematically at 16, the two dipole pairs 3, 5, 23, and 25 are fixed with respect to the area provided for the beam.

Figure 15:
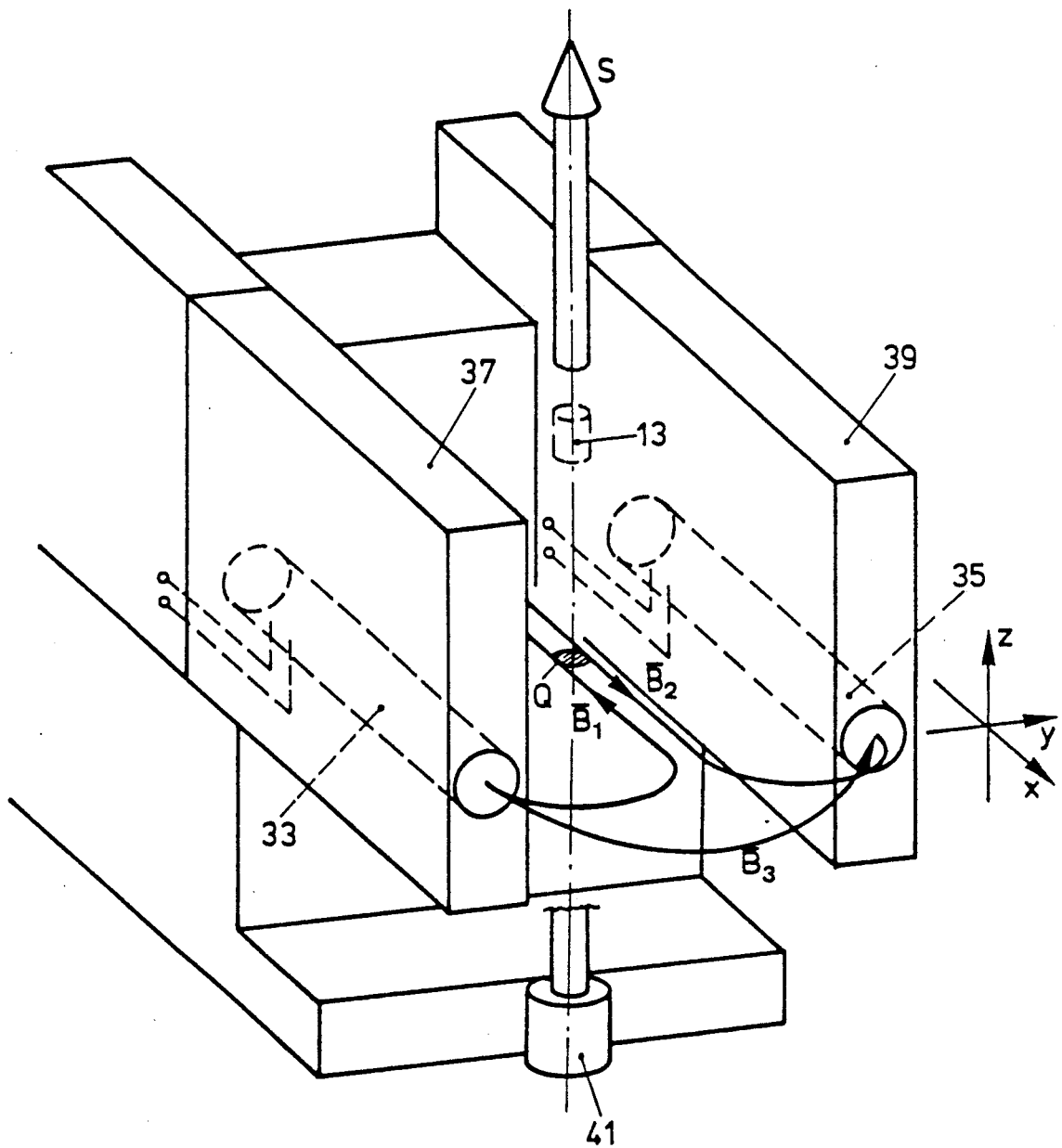
FIG. 15 is a perspective view of a preferred embodiment of the invention, in principle structured according to FIGS. 11 and 12.

FIG. 15 schematically shows a preferred structure according to the invention. Two electromagnets 33 and 35, corresponding to dipoles 3 and 5 of FIGS. 11, 12 or 13, are embedded parallel to each other in respective jaw-like mounts 37 and 39. The mounts 37 and 39 are at least in the area of the electromagnets 33, 35 implemented of a non-ferromagnetic material, but are, so that they can be able to be efficiently cooled, composed preferably of different metals, in particular of parts of copper and stainless steel respectively.

In a manner schematically represented, a securing arrangement for a beam generator 41 is provided which emits the beam S, in particular the electron beam, centrally between the mounts 37 and 39. The field course with the flux density field e,ovs/B/ $_1$, e,ovs/B/ $_2$ is drawn by example in FIG. 15, as is the transverse field e,ovs/B/ $_3$.

With the configuration according to the invention or the methods according to the invention, a regulating range of the area of the beam on a target of 1:10 is achieved, for example from a 5 mm to a 50 mm spot diameter, even with a beam deflection of approximately 270°. This can be achieved dynamically with regulating frequencies of up to 1 kHz. It is also readily possible, potentially to pulse the bundeling of the beam according to the invention.

Due to extensive decoupling of the spatial position control of the beam impingement area on a target, it is also possible, with the stated deflection of approximately 270° on a path with a diameter of approximately 4 to 5 cm, to guide the impingement area with a frequency of a few 100 Hz in a grid with a grid point distance of approximately 1 to 2mm, over the target and to control the particle mass of focussing control with the stated regulating frequency.

While specific embodiments of the invention have been shown and described in derail to illustrate the application of the principles of the invention, it will be understood that the invention may be embodied otherwise without departing from such principles.

What is claimed is:

1. A method for the control of a particle mass evaporated per unit time from a target, by a particle beam having a mass current and striking the target at an impingement area, comprising:
   positioning the impingement area of the beam on the target; and
   varying the extent of the impingement area of the beam on the target in a manner which is decoupled from the positioning and from the mass current of the beam.

2. A method for the regulation of a particle mass occurring per unit time in a spatial region due to evaporation of a target with the aid of a charged particle beam having a mass current, comprising
   varying the extent of an impingement area of the particle beam on the target for regulating the particle mass evaporated from the target per unit time, in a manner which is at least essentially decoupled from a position and a mass current of the beam, the impingement area extent being varied as a regulating variable for the particle mass.

3. A method for the selective detection of a particle mass occurring per unit time in a spatial region due to the evaporation of at least one target with the aid of at least one charged particle beam having a mass current, the method comprising:
   modulating the particle mass evaporated per unit time, by modulating the extent of an impingement area of the particle beam on the target;
   detecting all particles in the spatial region to form a detection signal; and
   selectively demodulating the detection signal to measure the particle mass from the beam in the spatial region.

4. A method for the regulation of a particle mass occurring per unit time in a spatial region due to the evaporation of at least one target with the aid of at least one electron beam having a mass current, the method comprising:
   modulating the particle mass evaporated per unit time from the target by modulating the extent of an impingement area of the electron beam on the target; and
   detecting the particle mass in the spatial region originating from the target by selective demodulation as a measured regulating variable for regulating the particle mass.

5. A method as stated in claims 1, 2, 3 or 4, including changing the mass current of the particle beam to cause slow changes in the particle mass evaporating from the target.

6. A method as stated in claims 1, 2, 3 or 4, including controlling the particle beam to change the dwelling time of the particle beam on the impingement area.

7. A method as stated in claim 3 or 4, including modulating the extent of the impingement area at least essentially without influencing the position of the impingement area and the mass current of the particle beam.

8. A method as stated in claim 4, including positioning the beam on the impingement area and varying the extent of the impingement area of the beam on the target in a manner which is decoupled from the mass current, and from the positioning of the beam.

9. A method as stated in claims 1, 2, 3 or 4, including magnetically focussing the beam for changing of the extent of the impingement area, the beam being of monopolarly charged particles.

10. A method as stated in claims 1, 2, 3, or 4, wherein the beam (S) is made of monopolar charged particles, the extent of a beam penetration area (Q) through a first plane ($E_1$) which is transverse to a beam propagation direction (z) being controlled at least in a first direction (R, Y) by applying a magnetic flux density field on both sides of a second plane ($E_2$) through the penetration area (Q) which is perpendicular to the direction (R, Y) and to the first plane ($E_1$), the magnetic flux density fields having, on both sides of the second plane ($E_2$), and in the first plane ($E_1$), parallel vector components wherein the vector components ($B_1$, $B_2$), are applied on each since of the second plane ($E_2$) with a polarity, the polarity on the one side of the second plane ($E_2$) being selected to be the reverse of that on the other side of the second plane ($E_2$)

11. A method as stated in claim 10, wherein the courses of the fields in the region of the beam penetration area (Q) on both sides of the second plane ($E_2$) are substantially parallel over at least a length corresponding to the extent of the penetration area.

12. A method as stated in claim 10, wherein the flux density fields ($B_1$, $B_2$) on both sides of the second plane ($E_2$) are applied symmetrically with respect to their magnitude and this symmetry is retained on controlled variation of the fields ($B_1$, $B_2$).

13. A method as stated in claim 10, wherein the fields ($B_1$, $B_2$) on both sides of the second plane ($E_2$) are constant over an area significantly longer than the extent of the penetration area (Q).

14. A method as stated in claim 10, including applying a second flux density field ($B_3$, $B_4$) on both sides of a third plane ($E_3$) which is perpendicular to the first plane ($E_1$) and to the second plane ($E_2$) and comprising a second direction (y), the second flux density fields ($B_3$, $B_4$) having parallel vector components of reverse polarity, and symmetrical magnitudes on respective sides of the third plane ($E_3$).

15. A method as stated in claim 14, wherein the courses of the second flux density fields in the region of the beam penetration area (Q), on both sides of the third plane are substantially parallel over at least a length corresponding to the penetration area extent.

16. A method as stated in claim 14, wherein the fields on both sides of the third plane are constant on both sides of the third plane over an area significantly longer than the extent of the penetration area.

17. A method as stated in claim 14, wherein each second field ($B_3$, $B_4$) is applied so that the polarities of field vectors ($B_1$, $B_2$, $B_3$, $B_4$) of all the fields alternate around the penetration area (Q) through the first plane ($E_1$).

18. A method as stated in claim 14, wherein each second magnetic flux density field ($B_3$, $B_4$) is applied substantially in the first plane ($E_1$).

19. A method as stated in claim 14, wherein the first ($B_1$, $B_2$) and the second ($B_3$, $B_4$) magnetic flux density fields are applied offset in the direction of beam propagation (z) and the first and second flux density fields are decoupled and shielded against each other.

20. A method as stated in claim 10, wherein the beam (S) is additionally deflected, in such a manner, that its penetration area (Q) through the first plane ($E_1$) is displaceably controlled, the controlled deflection ($B_U$) being carried out in the second plane ($E_2$) in such a way that the beam penetration area (Q) is displaced substantially parallel to the vector components of the first magnetic flux density field ($B_1$, $B_2$).

21. A method as stated in claim 14, wherein the effect of at least one of the applied magnetic flux density fields ($B_1$, $B_2$, $B_3$, $B_4$) is fixed to a beam target area (M) with respect to the effect on the penetration area (Q) through spatial fixing of at least one constriction region (K) of the beam.

22. An apparatus for the control of a particle mass evaporated per unit time from a target by a particle beam having a mass current, comprising:
   a control device for influencing the extent of the impingement area of the beam on the target and;
   means for controlling the position of the impingement area; and
   the effects of the control device being essentially without influence on the position means for the position of the impingement area, and the mass current of the particle beam.

23. A control circuit apparatus for regulation of a particle mass occurrings per unit time in a spatial region due to the evaporation of a target with the aid of a charged particle beam, the beam having a mass current, comprising:
   means for varying the extent of an impingement area of the particle beam on the target, said means being a final control element for the beam; and
   means for positioning the impingement area, said means for varying acting without influencing the position of the impingement area and the mass current of the particle beam, for regulating the extent of the impingement area.

24. A measuring apparatus for the selective measurement of a particle mass occurring per unit time in a spatial region due to the evaporation of at least one target with the aid of a charged particle beam having a mass current, comprising:
   a modulation unit for modulating the evaporated particle mass;
   a detector of particles in the spatial region; and
   a demodulation unit connected to the detector for demodulating a signal from the detector to measure the particle mass evaporated by the charged particle beam.

25. A control circuit apparatus for the regulation of a particle mass occurring per unit time in a spatial region due to the evaporation of at least one target with the aid of at least one electron particle beam having a mass current, comprising:
   a modulation unit for modulating the evaporated particle mass in the spatial region, by varying the extent of an impingement area of the at least one target;
   a particle detector for detecting particles int eh spatial region; and
   a demodulation unit connected to the detector and having an output used as a measured regulating variable signal for the particle mass.

26. An apparatus as stated in claims 22, 23 or 25, including a unit for varying the mass current of the particle beam to cause slow variations of the particle mass.

27. An apparatus as stated in claims 22, 23 or 25, including a unit for varying the dwelling time of the impingement area of the particle beam on the target.

28. An apparatus as stated in claims 24 or 25, wherein the modulation unit at least substantially modulates the extent of the impingement area without influencing the position of the impingement area and the mass current of the particle beam.

29. An apparatus as stated in claim 25, including a control device acting as a last elements on the beam, for influencing the extent of an impingement area of the beam on the target, and position means for controlling the position of the impingement area, the effects of the control device being substantially without influence on the position means for the position of the impingement area, and the mass current of the particle beam.

30. An apparatus as stated in claims 22, 23, 24, or 25, including a magnetic focussing unit for the particle beam for varying the particle mass.

31. An apparatus as stated in claims 22, 23, 24 or 25, including bundeling means for varying the particle mass evaporated from the target by changing bundeling of the beam, the beam being made of monopolar charged particles, a controlled magnet configuration provided in a beam area (13) for beam penetration, varying the extent of the beam in a penetration area (Q) through a first plane ($E_1$) transverse to the beam area, in a controlled manner and in at least one direction (Y), the magnet configuration generating a magnetic flux density field which is in the first plane ($E_1$) with vector components which are parallel to each other on both sides of a second plane ($E_2$) perpendicular to the direction (Y) and to the first plane ($E_1$) as well as through the beam penetration area (Q), and the magnet configuration (3, 5, 23, 25, 33, 35) being implemented so that the vector components ($B_1$, $B_2$) on each side of the second plane ($E_2$) have a polarity which, on one side of the second plane ($E_2$), is reverse to that on the other side of the second plane.

32. An apparatus as stated in claim 31, wherein the magnet configuration (3, 5, 23, 25, 33, 35) is implemented so that a course of the flux density field ($B_1$, $B_2$) on both sides of the second plane ($E_2$) is substantially parallel over at least an area corresponding to the beam penetration area (Q)..

33. An apparatus as stated in claim 31, including a control (11) for the magnet configuration for controlling the configuration so that the flux density fields on both sides of the second plate ($E_2$) have magnitudes symmetrical with respect to the second plane.

34. An apparatus as stated in claim 31, wherein the magnet configuration (3, 5, 23, 25, 33, 35) is implemented so that a course of the flux density field ($B_1$, $B_2$) on both sides of the second plane $E_2$) is constant over an area which is substantially longer than the extent of the penetration area (Q).

35. An apparatus as stated in claims 31, wherein the magnet configuration has two magnetic dipoles (3, 5, 23, 25, 33, 35) disposed substantially parallel to the second plane ($E_2$).

36. An apparatus as stated in claim 35, wherein the two magnetic dipoles (3, 5, 23, 25, 33, 35) lie substantially in the first plane ($E_1$).

37. An apparatus as stated in claim 36, wherein the magnetic dipoles (3, 5, 23, 25, 33, 35) in the first plane ($E_1$) are disposed symmetrically with respect to the second plane ($E_2$).

38. An apparatus as stated in claim 31, including a controlled deflection unit ($B_U$) for the beam (S), for causing a beam deflection substantially in the second plane ($E_2$).

39. An apparatus as stated in claims 31, wherein the magnet configuration generates a second flux density field ($B_3$, $B_4$) perpendicular to the second plane ($E_2$) with a reverse polarity on both sides of the beam area (13) for penetration of the beam (S).

40. An apparatus as stated in claims 39, including a beam generator for generation of the beam and an electron-optical system for generating along beam propagation directions, at least the constriction region (K) of the beam (S), the beam generator, the magnet configuration (3, 5, 23, 25, 33, 35), and the deflection unit ($B_U$) being tuned to each other so that a penetration area cross-section change in the area of influence of the magnetic flux density fields ($B_1$, $B_2$, $B_3$, $B_4$) inversely effects a diameter change of a beam target impingement area at least in a first direction (X).

41. An apparatus as stated in claim 31, wherein the magnet configuration has two magnetic dipoles (3, 5, 33, 35) each disposed in two mounts (37, 39) held at a distance from each other and the area for the beam passes between the mounts (37, 39).

42. An apparatus as stated in claim 31, including a positioning and filing arrangement for a beam generator (15, 41) operating so that the generated beam (S) passes through the beam area (13) of beam penetration.

43. An apparatus as stated in claim 41, wherein the mounts (37, 39) in the area of the dipoles (33, 35) comprise a substantially non-ferromagnetic material and the dipoles are encapsulated in a vacuum-tight manner in the mounts (37, 39).

44. An apparatus as stated in claim 41, wherein the mounts comprise parts of different metals.

45. An apparatus as stated in claims 41, wherein the magnet configuration comprises permanent magnets.

46. An apparatus as stated in claim 44, wherein the mounts are made of copper and stainless steel.

47. An apparatus as stated in claim 41, wherein the magnet configuration comprises electromagnets.

* * * * *